(12) United States Patent
Kawanishi et al.

(10) Patent No.: US 7,183,671 B2
(45) Date of Patent: Feb. 27, 2007

(54) SEMICONDUCTOR DEVICE AND METHOD FOR PRODUCING THE SAME

(75) Inventors: Kei Kawanishi, Osaka (JP); Noriyuki Shimazu, Osaka (JP); Ayako Morita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 421 days.

(21) Appl. No.: 10/917,301

(22) Filed: Aug. 13, 2004

(65) Prior Publication Data

US 2005/0067899 A1 Mar. 31, 2005

(30) Foreign Application Priority Data

Sep. 30, 2003 (JP) ............................. 2003-342446

(51) Int. Cl.
*H01H 35/00* (2006.01)
*H01H 47/00* (2006.01)
*H01H 83/00* (2006.01)
*H02B 1/24* (2006.01)
*H02H 3/00* (2006.01)

(52) U.S. Cl. ......................................... 307/130; 257/48

(58) Field of Classification Search ................ 307/130, 307/31; 257/48; 324/765, 754
See application file for complete search history.

(56) References Cited

U.S. PATENT DOCUMENTS 5,404,099 A * 4/1995 Sahara ..................... 324/158.1

FOREIGN PATENT DOCUMENTS

JP 5-291368 11/1993

* cited by examiner

*Primary Examiner*—Brian Sircus
*Assistant Examiner*—Carlos Amaya
(74) *Attorney, Agent, or Firm*—McDermott Will & Emery LLP

(57) ABSTRACT

In a power supply disconnection cell, a power supply connection switch is added in parallel to a protection transistor having a fixed gate. The power supply connection switch electrically connects or disconnects a plurality of power supplies according to a control signal externally input through an external control terminal. In a WLBI process, a plurality of power supplies are connected by the power supply connection switch, and therefore, a voltage is applied to other power supply pads by voltage application to a specific input terminal. After the WLBI process, the power supplies are disconnected, and electric charges produced by an abnormal voltage, such as a surge, or the like, are released by the protection transistor provided between the power supplies, whereby breakdown of a semiconductor device is prevented.

11 Claims, 3 Drawing Sheets

SEMICONDUCTOR DEVICE AND METHOD FOR PRODUCING THE SAME

BACKGROUND OF THE INVENTION

The present invention relates to a power supply disconnection system for a semiconductor device, which has the function of controlling connection and disconnection between a plurality of power supplies in the semiconductor device and the function of preventing a surge breakdown after a package assembling process, such that the number of power supplies which apply a voltage in a wafer level burn-in (WLBI) process can be reduced.

In recent years, along with the advancement of functional synthesis in a system LSI device, a larger number of system LSI devices have incorporated analog circuits. Further, a separate power supply which is disconnected from the other power supplies is necessary for each analog circuit in order to avoid effects of noise, and the like. To this end, multi power supply design in LSI devices has been becoming mainstream.

In addition, a process technique whose resolution has been increasing is employed, and accordingly, the number of separate power supplies has been increasing such that, for example, the supply voltage of an internal circuit is different from that of an IO circuit.

Further, a micro-process technique is employed to reduce the chip area, and achievement of a large diameter wafer increases the number of chips obtained from the wafer. Shift from package burn-in (package BI) wherein the burn-in process is performed after package assemblage has been done to WLBI wherein a wafer is processed at once so that the cost is greatly reduced as compared with the package BI has been rapidly advancing.

In some power supply disconnection systems for conventional semiconductor devices, in general, a power supply disconnection cell is provided between power supplies.

FIG. 3 shows the above-described conventional semiconductor device. The semiconductor device of FIG. 3 includes a first analog circuit 100 and a second analog circuit 110. The first analog circuit 100 is connected to a first analog IO region 103 including a first analog VDD terminal 101 which supplies a VDD voltage and a first analog VSS terminal 102 which supplies a VSS voltage. The second analog circuit 110 is connected to a second analog IO region 113 including a second analog VDD terminal 111 which supplies a VDD voltage and a second analog VSS terminal 112 which supplies a VSS voltage. The semiconductor device of FIG. 3 further includes a power supply disconnection cell 200 for disconnecting the first analog IO region 103 and the second analog IO region 113.

The power supply disconnection cell 200 includes two protection transistors 201 and 202 between power supplies such that the gates of the protection transistors 201 and 202 are connected to the VSS power supply line. The transistor 201 is provided by a source-drain connection between the VDD power supply lines that exist between the analog IO regions 103 and 113. The transistor 202 is provided by a source-drain connection between the VSS power supply lines that exist between the analog IO regions 103 and 113. In the structure of FIG. 3, when an abnormal voltage which exceeds a rating is applied to a VSS terminal, the protection transistors 201 and 202 function such that electric charges are released through the source-drain. Thus, the transistors 201 and 202 serve to prevent a quality deterioration due to surge breakdown, or the like, in the analog IO regions 103 and 113.

Japanese Unexamined Patent Publication No. 05-291368 discloses a technique for achieving a reduction in the number of pads for probing in a WLBI process. The technique of Japanese Unexamined Patent Publication No. 05-291368 is that power supply potential lines are connected to each other through a transistor, and ground potential lines are connected to each other through a transistor. The transistor is controlled by a voltage input through a terminal for a voltage stress test which is connected to the gate of the transistor, and a short circuit is caused between power supply potential lines such that these lines are temporarily integrated, while another short circuit is caused between ground potential lines such that these lines are also temporarily integrated. The number of pads to be probed is reduced according to the number of short circuits, i.e., the number of short-circuited transistors.

In the above conventional technique, probes are placed on the pads for supplying the power supply voltage, inputting a control signal or input signal, and extracting a monitor output signal in the WLBI process. However, the number of electrically-connectable and probeable pads over one wafer is limited due to the flatness of the wafer, the probe pressure against the wafer, and the like. Because of this restriction, in a conventional semiconductor device, the number of probeable pads allocated to each chip is reduced as the number of chips obtained from one wafer increases. As a result, voltage application cannot be achieved in all of the separate power supplies in an LSI device of a multi power supply design, and WLBI cannot be employed in this device.

In the conventional technique disclosed in Japanese Unexamined Patent Publication No. 05-291368, means for reducing the number of terminals used in the WLBI process is to newly provide a transistor that can be short-circuited to temporarily integrate a plurality of power supply lines to which equal voltages are applied. However, this results in an increase in the chip area and causes an increase in cost.

Furthermore, since short-circuited transistors do not function as protection transistors, deterioration in quality may be caused due to a surge, or the like.

SUMMARY OF THE INVENTION

The present invention overcomes the above-described problems in the conventional techniques. An objective of the present invention is to provide a semiconductor device wherein WLBI, which is effective in decreasing the cost, is achieved with voltage application to all of the power supply pads without reducing input/output signals in the WLBI process, and further, with substantially no effect of an increase in the chip area and substantially no increase in a design period. Preferably, the semiconductor device has protection between power supplies after WLBI so that quality deterioration, such as surge breakdown, or the like, is prevented.

In order to achieve the above objective, there is provided connection means for electrically switching connection/disconnection between a plurality of power supply lines to which an equivalent voltage is applied. A control signal is input to the connection means separately from a voltage applied to the power supply lines, such that the connection means is not electrically conductive when a rating voltage of a semiconductor device is applied but is electrically conductive when a voltage exceeding the rating or an abnormal voltage, such as a surge, or the like, is applied.

Specifically, a semiconductor device of the present invention comprises: a plurality of circuits each having a predetermined function; a plurality of power supply cells for receiving a voltage from an external element and outputting a predetermined power supply voltage to a corresponding circuit; and connection means for controlling electrical connection among the plurality of power supply cells, wherein if the difference between a voltage at an input terminal of one of the plurality of power supply cells and a voltage at an input terminal of another one of the plurality of power supply cells has a value within a predetermined range, the connection means electrically disconnects the input terminals of these power supply cells, if the difference has a value that exceeds the predetermined range, the connection means electrically connects the input terminals of the plurality of power supply cells, and the connection means is controlled according to an input control signal as to whether the input terminals of the plurality of power supply cells are electrically connected or disconnected.

In the semiconductor device of the present invention, the power supply cell includes the connection means.

In the semiconductor device of the present invention, the connection means includes: a power supply connection switch which becomes electrically conductive or electrically non-conductive according to the control signal; and a protection transistor connected in parallel to the power supply connection switch, a gate of the protection transistor being connected to a source or drain.

In the semiconductor device of the present invention, the connection means includes a protection transistor; and the protection transistor receives at its gate a voltage applied to any of the power supply cells and a voltage determined according to the control signal and is controlled as to whether or not its source-drain region is electrically conductive.

The semiconductor device of the present invention further comprises a control terminal, wherein the control signal is input from the outside of the semiconductor device to the control terminal.

The semiconductor device of the present invention further comprises a control terminal pad for receiving the control signal; and a power supply terminal pad which is electrically connected to the control terminal pad and which is connected to an external power supply.

The semiconductor device of the present invention further comprises a package, wherein the package includes a connection point of the control terminal pad and the power supply terminal pad.

The semiconductor device of the present invention further comprises a resistor which is connected between the control terminal and any of outputs of the power supply cells.

The semiconductor device of the present invention further comprises an internal control circuit for generating the control signal according to a plurality of signals in the semiconductor device.

A semiconductor device of the present invention comprises: a plurality of circuits each having a predetermined function; a plurality of power supply cells for receiving a voltage from an external element and outputting a predetermined power supply voltage to a corresponding circuit; and a protection transistor for controlling electrical connection among the plurality of power supply cells, a gate of the protection transistor being connected to a source or drain, wherein if the difference between a voltage at an input terminal of one of the plurality of power supply cells and a voltage at an input terminal of another one of the plurality of power supply cells has a value within a predetermined range, the protection transistor electrically disconnects the input terminals of these power supply cells, and if the difference has a value that exceeds the predetermined range, the protection transistor electrically connects the input terminals of the plurality of power supply cells; and a disconnectable line connected in parallel to the protection transistor.

A semiconductor device production method of the present invention comprises the steps of: forming a semiconductor device, including a plurality of circuits each having a predetermined function a plurality of power supply cells for receiving a voltage from an external element and outputting a predetermined power supply voltage to a corresponding circuit, and a protection transistor for controlling electrical connection among the plurality of power supply cells, a gate of the protection transistor being connected to a source or drain, wherein if the difference between a voltage at an input terminal of one of the plurality of power supply cells and a voltage at an input terminal of another one of the plurality of power supply cells has a value within a predetermined range, the protection transistor electrically disconnects the input terminals of these power supply cells, and if the difference has a value that exceeds the predetermined range, the protection transistor electrically connects the input terminals of the plurality of power supply cells and a disconnectable line connected in parallel to the protection transistor; applying a voltage to any of the power supply cells to inspect the semiconductor device; and disconnecting the disconnectable line.

With the above features of the present invention, if the difference in voltage between input terminals of a plurality power supply cells to which a voltage is externally input is within a predetermined range, the connection means electrically disconnects the input terminals. If the difference in voltage between the input terminals exceeds the predetermined range, the connection means electrically connects the input terminals. Thus, in normal operation, the connection means electrically disconnects the input terminals of the power supply cells from each other. When an abnormal voltage caused by a surge, or the like, is applied to one of the input terminal so that the difference in voltage between input terminals exceeds a predetermined value, the input terminals are electrically connected to each other to allow release of electric charges. Furthermore, the connection means controls whether or not the input terminals of the plurality of power supply cells are electrically connected according to a control signal input thereto, whereby the input terminals of the power supply cells to which an equivalent voltage is to be applied are electrically connected.

According to the present invention, the connection means is provided to a power supply cell, whereby the chip area is reduced as compared with the case of providing an extra cell for the connection means.

According to the present invention, it is controlled according to a control signal whether or not a power supply connection switch electrically connects the input terminals of a plurality of power supply cells. Thus, the input terminals of the power supply cells to which an equivalent voltage is to be applied are electrically connected. When the difference in potential between input terminals of the power supply cells is within a predetermined range, an protection transistor between power supplies, which are connected in parallel to the power supply connection switch, electrically connects the input terminals. Thus, effects of noise produced by other power supply cells, or the like, are avoided. When the difference in potential between the input terminals of the power supply cells exceeds the predetermined range, i.e., when an abnormal voltage, such as a surge, or the like, is applied to one of the input terminals, the input terminals are electrically connected such that electric charges are released.

According to the present invention, a protection transistor between power supplies is used as connection means. The gate voltage applied to this transistor is controlled to switch connection/disconnection of the power supplies. When a voltage that exceeds the rating is applied to any of the power supply cells, the protection transistor functions to release electric charges to other power supply cells through a source-drain.

A semiconductor device of the present invention has a control terminal pad and a power supply terminal pad. In the package assembling process, these pads are connected to each other, whereby a voltage for disconnecting the power supply cells from each other is supplied from an input terminal of the power supply cell to the control terminal. Thus, it is not necessary to provide an extra power supply terminal for supplying a voltage which disconnects the power supply cells during the operation of the semiconductor device to a control terminal. As a result, a reduction in the number of terminals is possible.

According to the present invention, a package has connection points for connecting a control terminal pad and a power supply terminal pad. Thus, even in the case where the control terminal pad and the power supply terminal pad provided outside are not adjacent to each other so that it is impossible to directly connect these pads, the pads are connected through the connection points. As a result, it is not necessary to provide an extra power supply terminal for supplying a voltage that disconnects the power supplies to the control terminal, and accordingly, a reduction in the number of terminals is possible.

According to the present invention, a resistor is connected between the control terminal pad and any of the outputs of the power supply cells, and the potential of the control terminal is pulled up or pulled down to and fixed at the supply potential after the package assembling process. Thus, it is not necessary to provide an extra power supply terminal for supplying a voltage that disconnects the power supplies to the control terminal during operation, and accordingly, a reduction in the number of terminals is possible. Further, an abnormal voltage, such as a surge, or the like, which is applied to an input terminal of a power supply cell, function as a control signal for the connection means, such that the connection means connects the input terminals to each other.

DESCRIPTION OF THE PREFERRED EMBODIMENTS

Hereinafter, embodiments of the present invention are described with reference to the drawings.

Embodiment 1

Figure 1:
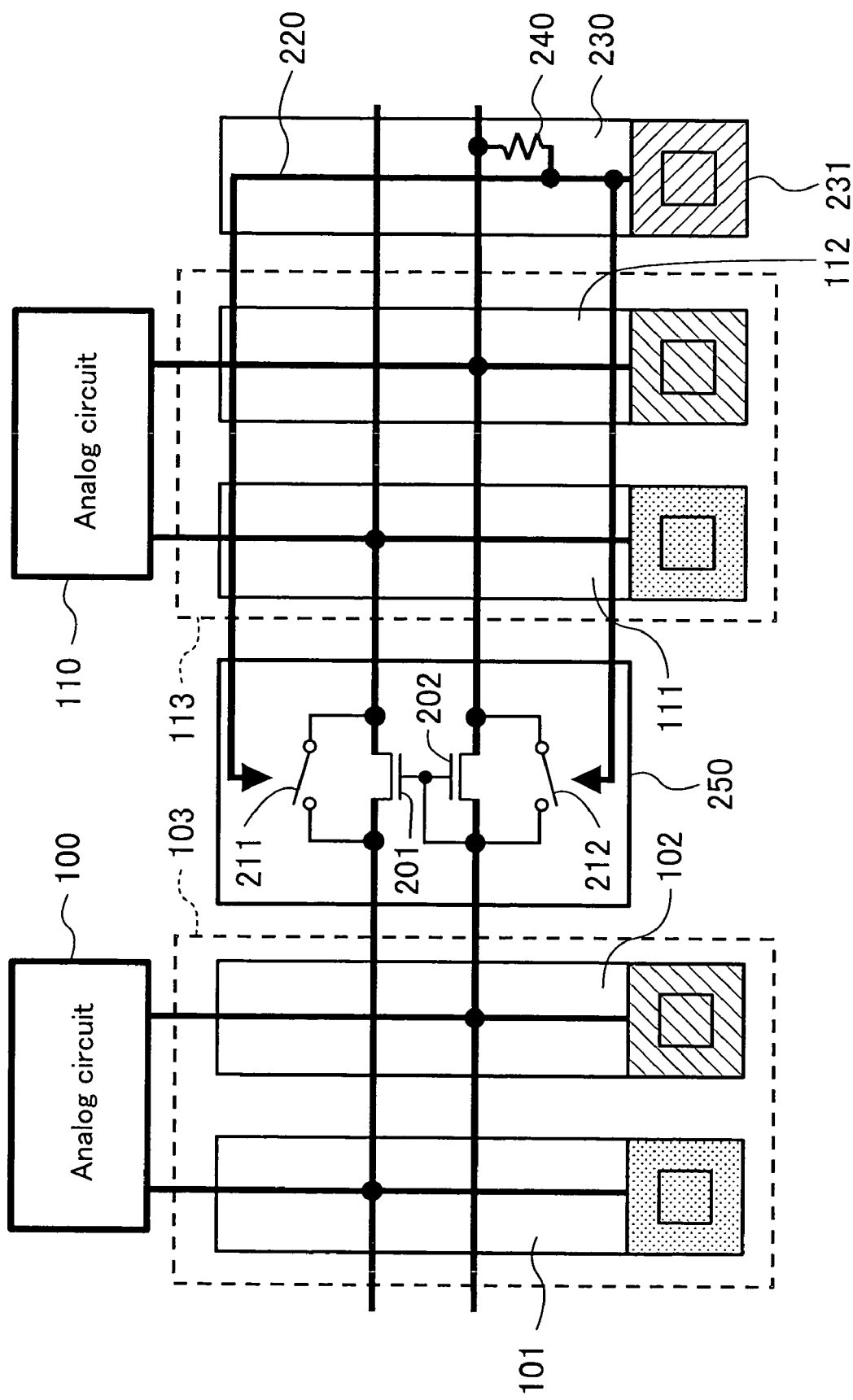
FIG. 1 is a circuit diagram of a semiconductor device according to embodiment 1 of the present invention.

FIG. 1 is a circuit diagram showing a semiconductor device according to embodiment 1 of the present invention. In FIG. 1, reference numerals 100 and 110 denote analog circuits having predetermined functions, each of which requires a separate power supply in order to avoid effects of noise, and the like. Reference numeral 103 denotes an analog IO region for the analog circuit 100, which includes a VDD terminal 101 for supplying an externally-input VDD voltage to the analog circuit 100 and a VSS terminal 102 for supplying an externally-input VSS voltage to the analog circuit 100. Reference numeral 113 denotes an analog IO region for the analog circuit 110, which includes a VDD terminal 111 for supplying an externally-input VDD voltage to the analog circuit 110 and a VSS terminal 112 for supplying an externally-input VSS voltage to the analog circuit 110. The IO regions 103 and 113 each have two power supply cells. Each power supply cell includes a protection circuit, a VDD or VSS terminal (input terminal), and a pad connected to the input terminal.

Reference numeral 250 denotes a power supply disconnection cell including protection transistors 201 and 202 between power supplies. The gates of the protection transistors 201 and 202 are connected to the VSS terminal 102. The protection transistor 201 is provided between power supply lines VDD which are respectively connected to the analog circuits 100 and 110. The protection transistor 202 is provided between power supply lines VSS which are respectively connected to the analog circuits 100 and 110. Reference numerals 211 and 212 denote switches for connecting power supplies (hereinafter, referred to as "power supply connection switches"), which are controlled by a control signal 220 that is input to an external control terminal 230 through a pad 231 from the outside of the semiconductor device. In embodiment 1, these switches 211 and 212 are closed by application of a high potential (hereinafter, referred to as "H") and opened by application of a low potential (hereinafter, referred to as "L"). The switch 211 is connected in parallel to the protection transistor 201, and the switch 212 is connected in parallel to the protection transistor 202. Reference numeral 240 denotes a pull down resistor which is connected between the external control terminal 230 and power supply line VSS. The protection transistors 201 and 202 and the switches 211 and 212 constitute connection means.

Hereinafter, an operation of the semiconductor device having the structure shown in FIG. 1 is described.

During a WLBI process, the power supply connection switches 211 and 212 are controlled by the control signal 220 which is input to the external control terminal (control terminal) 230 separately from a voltage applied to a power supply pad in an analog IO region (pad of a power supply cell), such that electrical connection is established between a plurality of power supplies. Thus, a voltage is applied to other power supply pads along with application of a voltage to a specific power supply pad. Therefore, it is not necessary to probe all of the power supply pads, and WLBI, which is effective in cost reduction, is realized without omitting any of a control signal, an input signal, and an input/output signal to be monitored. In embodiment 1, it is not necessary to apply a voltage to the analog VDD terminal 111 and the analog VSS terminal 112, and as a result, the number of pads probed in the WLBI process is reduced.

The power supply connection switches 211 and 212 are off except during the WLBI process. When an abnormal voltage, such as a surge, or the like, is applied to, for example, the VSS terminal 102, the potential at the VSS terminal 102 exceeds the potential at the VSS terminal 112. If the potential difference between these terminals is equal to or higher than a predetermined value, the protection transistors 201 and 202 are momentarily turned on so that electric charges are released in a direction from the VSS terminal 102 to the VSS terminal 112. Thus, breakdown, such as a surge, or the like, is prevented. In FIG. 1, the gates of the protection transistors 201 and 202 are connected to the VSS terminal's side. That is, FIG. 1 shows an example of a countermeasure structure against surge for the VSS terminal 102. However, this structure is provided to other input terminals in the same fashion.

In embodiment 1, the pull down resistor 240 is provided between the external control terminal 230 and the VSS power supply. With this structure, when a voltage is not input to the external control terminal 230, the control signal 220 is pulled down to the potential of the VSS power supply to open the power supply connection switches 211 and 212, thereby disconnecting the power supplies of the analog circuits 100 and 110. Therefore, in a package assembling process, disconnection of power supplies is achieved by the function of the pull down resistor without providing an extra power supply terminal for fixing an external control terminal which provides a voltage for opening the power supply connection switches 211 and 212 and which is connected to the external control terminal 230. Accordingly, an increase in the number of terminals is suppressed.

In the case where the power supply connection switch is formed by a switch that turns off when a control signal for the switch is "H" and turns on when the control signal is "L", a pull up resistor (not shown) is connected between the external control terminal 230 and the VDD power supply, whereby the above-described effects are obtained.

Furthermore, in a package assembling process after the WLBI, a pad (control terminal pad) 231 of the external control terminal 230 and a pad of an external power supply terminal (not shown) which is externally supplied with a voltage for opening the power supply connection switches 211 and 212 are placed adjacent to each other, and the pad 231 of the external control terminal 230 and the pad of the external power supply terminal are connected to each other by wiring. As a result, the external control terminal 230 is fixed to a power supply potential at which the power supply connection switches 211 and 212 are open. That is, the power supply for supplying a voltage to the analog circuit 100 and the power supply for supplying a voltage to the analog circuit 110 are disconnected. Thus, disconnection of power supplies is realized by sharing externally-supplied voltage among the external control terminal 230 and an external power supply terminal (i.e., by applying the same voltage (externally-supplied voltage) to the external control terminal 230 and the external power supply terminal) without providing an extra power supply terminal for fixing the external control terminal 230 to a power supply potential for the purpose of disconnecting power supplies. As a result, an increase in the number of terminals in the package assembling process is suppressed.

In the case where the pad 231 of the external control terminal 230 and the pad of the external power supply terminal are not adjacent to each other so that it is impossible to directly connect these pads, an electrically-connectable pad connection portion (connection point) is provided in advance in a lead frame, a carrier, or the like, on a package, and an electrical connection is established in the package assembling process, whereby the same voltage is applied to the external control terminal 230 and the external power supply terminal. As a result, an increase in the number of terminals is suppressed in the package assembling process.

Furthermore, the semiconductor device may incorporate an internal control circuit (not shown) for controlling the power supply disconnection cell 250. The internal control circuit is capable of generating a control signal for controlling disconnection and connection of power supplies according to a plurality of signals included in a register of the semiconductor device, and the like, and outputting the generated control signal to the power supply connection switches 211 and 212. In this case, it is not necessary to provide the external control terminal 230, and accordingly, the chip area can be reduced.

In the above-described example of embodiment 1, power supply disconnection between two IO regions, the analog IO region 103 and the analog IO region 113, is described. However, according to the present invention, it is also possible to achieve connection and disconnection among three or more IO regions.

In the above-described example of embodiment 1, a power supply connection switch, which is connected in parallel to a protection transistor provided between power supplies, is controlled by a control signal input from an internal circuit or from an external device, such that the power supplies are connected in the WLBI process and then disconnected after the WLBI process. Alternatively, according to the present invention, it is possible that a disconnectable line, such as a fuse, or the like, is connected in parallel to the protection transistor. In the WLBI process, a test is performed with an uncut fuse, and after the WLBI process, the fuse is cut before assemblage of a package. In the case of fabricating such a semiconductor device, a semiconductor device including a protection transistor and a disconnectable line is formed, and then, a voltage is applied to an input terminal of any of a power supply cell to test the semiconductor device by WLBI, or the like. After the test, the disconnectable line is disconnected.

As described above, a semiconductor device of embodiment 1 employs a power supply disconnection system which controls electrical connection/disconnection between a plurality of power supplies. Thus, it is possible to reduce the number of power supply pads to which a voltage is applied in the WLBI process.

As described above, control of electrical connection/disconnection between a plurality of power supplies is achieved by external control through an external control terminal or an internal control circuit. Thus, an appropriate form can be selected according to various circumstances for disconnection of power supplies in a semiconductor device.

Embodiment 2

Figure 2:
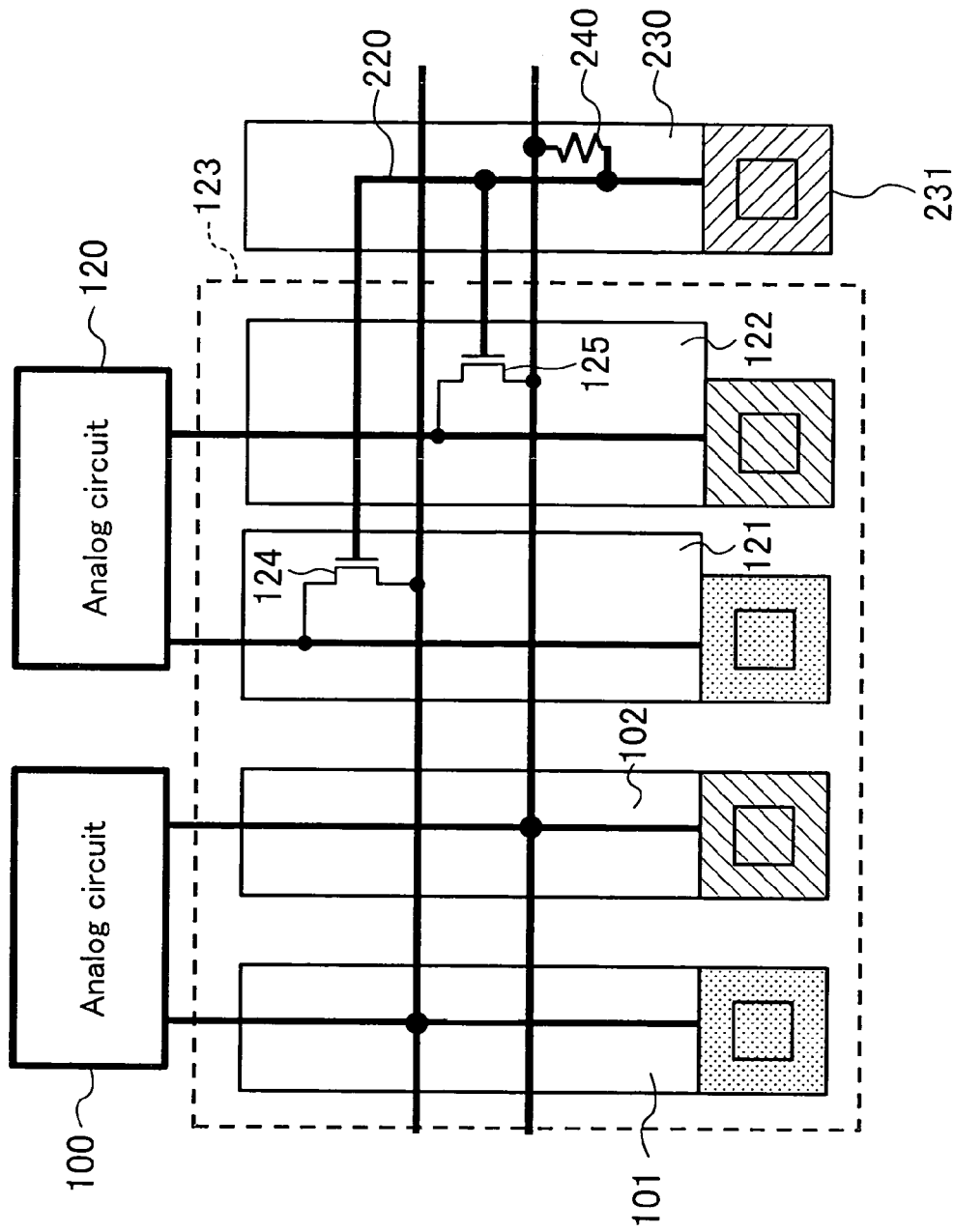
FIG. 2 is a circuit diagram of a semiconductor device according to embodiment 2 of the present invention.
Figure 3:
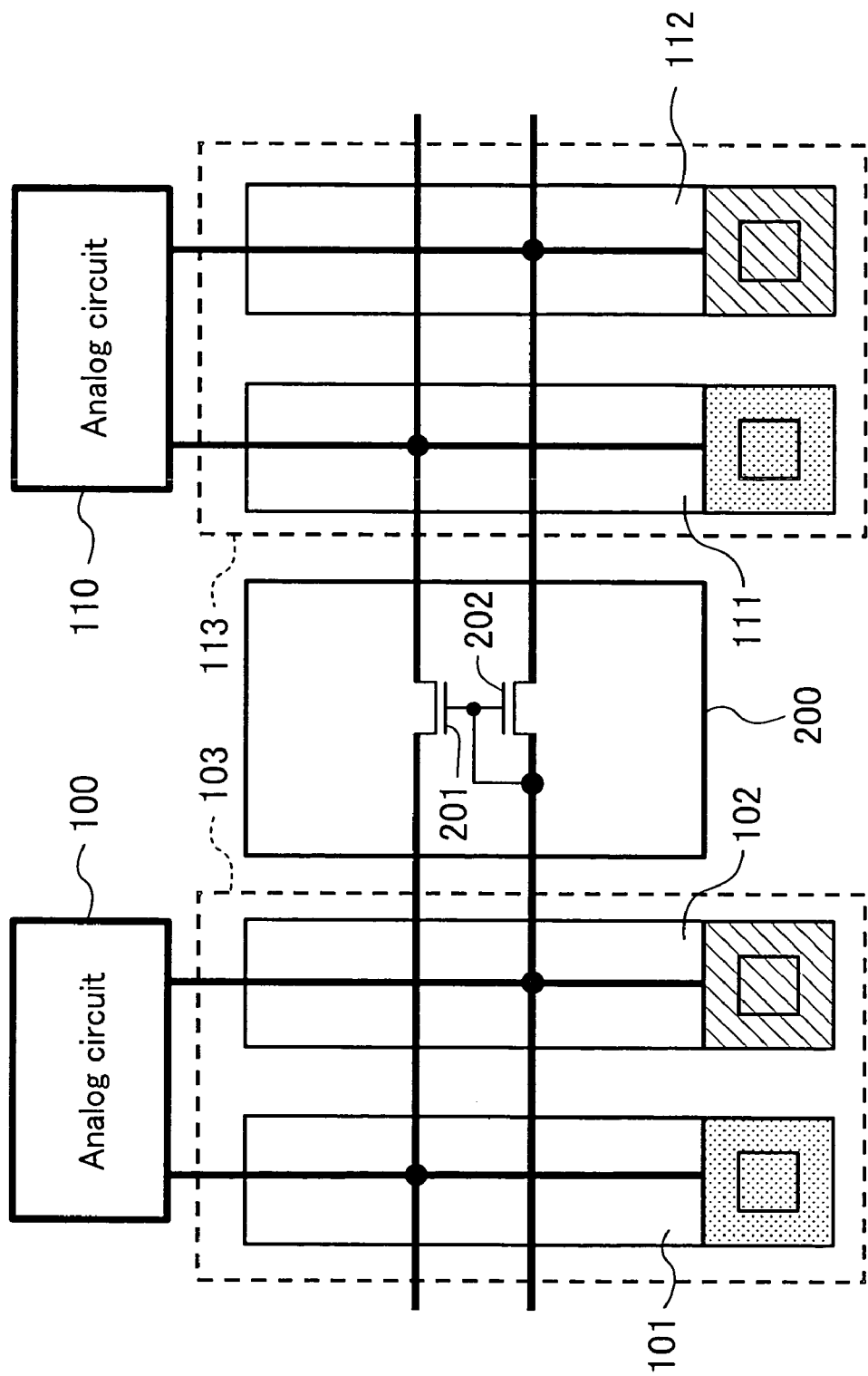
FIG. 3 is a circuit diagram of a conventional power supply disconnected semiconductor device.

FIG. 2 is a circuit diagram showing a semiconductor device according to embodiment 2 of the present invention. It should be noted that like elements are denoted by like reference numerals used in FIG. 1, and therefore, descriptions thereof are herein omitted.

In embodiment 2, a VDD terminal 101 and a VSS terminal 102 which supply a supply voltage to an analog circuit 100 and a VDD terminal 121 and a VSS terminal 122 which supply a supply voltage to an analog circuit 120 are placed in the same analog IO region 123. The analog IO region 123 includes protection transistors 124 and 125 between power supplies as connection means.

The semiconductor device of embodiment 2 does not include the power supply disconnection cell 250 which has been described in embodiment 1. One of the source and drain of the protection transistor 124 is connected to the VDD terminal 101, and the other one is connected to the VDD terminal 121. The protection transistor 124 controls disconnection and connection between power supplies according to the control signal 220 input to the gate. One of the source and drain of the protection transistor 125 is connected to the VSS terminal 102, and the other one is connected to the VSS terminal 122. The protection transistor 125 controls disconnection and connection between power supplies according to the control signal 220 input to the gate. The analog IO region 123 includes four power supply cells. Two of these four power supply cells which output voltages to the analog circuit 100 are the same as the power supply cells included in the IO region 103 of embodiment 1. One of the remaining two power supply cells, which output voltages to the analog circuit 120, includes the protection transistor 124, and the other one includes the protection transistor 125.

Hereinafter, an operation of the semiconductor device having the structure shown in FIG. 2 is described.

The protection transistors 124 and 125 are controlled according to the control signal 220 externally input to the external control terminal 230 through a pad 231, such that the transistors 124 and 125 disconnect a plurality of power supplies from each other during normal operation but electrically connect the plurality of power supplies to each other during the test, such as WLBI, or the like. With this structure, the effects achieved in the semiconductor device of FIG. 1 are also achieved in the semiconductor device of embodiment 2.

In the case where an abnormal voltage, such as a surge, or the like, is applied to any of the power supply cells, e.g., to the VSS terminal 102 in this example, a voltage is applied to the gates of the protection transistors 124 and 125 through a pull down resistor 240. Thus, both of the transistors 124 and 125 are turned on so that electric charges are released in a similar fashion as described in embodiment 1, whereby breakdown is prevented. Although not shown, the protection structure between power supplies is also provided to the other input terminals as described in embodiment 1.

Furthermore, also in this example, the external control terminal 230 is electrically connected to an external power supply terminal in the package assembling process such that the voltage applied to the external power supply terminal is commonly applied to the external control terminal 230, whereby an increase in the number of terminals is suppressed.

In the case where the external control terminal 230 and the external power supply terminal are not adjacent to each other so that it is impossible to directly connect these terminals, means for sharing the voltage applied to the external power supply terminal among these terminals by providing connection portions on a package substrate for bridging the terminals (such that the same voltage is applied to the external control terminal 230 and the external power supply terminal) can be provided.

Furthermore, the semiconductor device may incorporate an internal control circuit (not shown) capable of generating a control signal 220 for controlling disconnection and connection of power supplies according to a plurality of signals included in a register of the semiconductor device, and the like, and outputting the generated control signal. The control signal 220 is used as a control signal for controlling the transistors 124 and 125. In this case, it is not necessary to provide the external control terminal 230 as described in embodiment 1, and accordingly, the chip area can be reduced.

In embodiment 2, connection/disconnection of the power supplies which supply the electric power to the analog circuits 100 and 120 has been described. However, according to the present invention, connection/disconnection of a larger number of power supplies is also possible.

As described above, the power supply disconnection system of the semiconductor device described in embodiment 2 enables control of electrical connection/disconnection between a plurality of power supplies. Thus, the number of power supply pads to which a voltage is applied in the WLBI process is reduced. After the WLBI process, i.e., when the power supplies are disconnected, a protection transistor has the function of providing protection between power supplies, whereby a deterioration in quality due to surge breakdown, or the like, is prevented.

As described above, control of electrical connection/disconnection between a plurality of power supplies is achieved by external control through an external control terminal or an internal control circuit. Thus, an appropriate form can be selected according to various circumstances for disconnection of power supplies in a semiconductor device.

What is claimed is:

1. A semiconductor device, comprising:
    a plurality of circuits each having a predetermined function;
    a plurality of power supply cells for receiving a voltage from an external element and outputting a predetermined power supply voltage to a corresponding circuit; and
    connection means for controlling electrical connection among the plurality of power supply cells, wherein
        if the difference between a voltage at an input terminal of one of the plurality of power supply cells and a voltage at an input terminal of another one of the plurality of power supply cells has a value within a predetermined range, the connection means electrically disconnects the input terminals of these power supply cells,
        if the difference has a value that exceeds the predetermined range, the connection means electrically connects the input terminals of the plurality of power supply cells, and
        the connection means is controlled according to an input control signal as to whether the input terminals of the plurality of power supply cells are electrically connected or disconnected.

2. The semiconductor device of claim 1, wherein the power supply cell includes the connection means.

3. The semiconductor device of claim 1 or 2, wherein the connection means includes:
    a power supply connection switch which becomes electrically conductive or electrically non-conductive according to the control signal; and
    a protection transistor connected in parallel to the power supply connection switch, a gate of the protection transistor being connected to a source or drain.

4. The semiconductor device of claim 1 or 2, wherein:
    the connection means includes a protection transistor; and
    the protection transistor receives at its gate a voltage applied to any of the power supply cells and a voltage determined according to the control signal and is controlled as to whether or not its source-drain region is electrically conductive.

5. The semiconductor device of claim 1 or 2, further comprising a control terminal,
    wherein the control signal is input from the outside of the semiconductor device to the control terminal.

6. The semiconductor device of claim 5, further comprising:
    a control terminal pad for receiving the control signal; and
    a power supply terminal pad which is electrically connected to the control terminal pad and which is connected to an external power supply.

7. The semiconductor device of claim 6, further comprising a package, wherein the package includes a connection point of the control terminal pad and the power supply terminal pad.

8. The semiconductor device of claim 5, further comprising a resistor which is connected between the control terminal and any of outputs of the power supply cells.

9. The semiconductor device of claim 1 or 2, further comprising an internal control circuit for generating the control signal according to a plurality of signals in the semiconductor device.

10. A semiconductor device, comprising:
   a plurality of circuits each having a predetermined function;
   a plurality of power supply cells for receiving a voltage from an external element and outputting a predetermined power supply voltage to a corresponding circuit; and
   a protection transistor for controlling electrical connection among the plurality of power supply cells, a gate of the protection transistor being connected to a source or drain, wherein
      if the difference between a voltage at an input terminal of one of the plurality of power supply cells and a voltage at an input terminal of another one of the plurality of power supply cells has a value within a predetermined range, the protection transistor electrically disconnects the input terminals of these power supply cells, and
      if the difference has a value that exceeds the predetermined range, the protection transistor electrically connects the input terminals of the plurality of power supply cells; and
   a disconnectable line connected in parallel to the protection transistor.

11. A semiconductor device production method, comprising the steps of:
   forming a semiconductor device, including
      a plurality of circuits each having a predetermined function
      a plurality of power supply cells for receiving a voltage from an external element and outputting a predetermined power supply voltage to a corresponding circuit, and
      a protection transistor for controlling electrical connection among the plurality of power supply cells, a gate of the protection transistor being connected to a source or drain, wherein
         if the difference between a voltage at an input terminal of one of the plurality of power supply cells and a voltage at an input terminal of another one of the plurality of power supply cells has a value within a predetermined range, the protection transistor electrically disconnects the input terminals of these power supply cells, and
         if the difference has a value that exceeds the predetermined range, the protection transistor electrically connects the input terminals of the plurality of power supply cells and
      a disconnectable line connected in parallel to the protection transistor;
   applying a voltage to any of the power supply cells to inspect the semiconductor device; and
   disconnecting the disconnectable line.

* * * * *